(12) United States Patent
Chang et al.

(10) Patent No.: US 12,211,750 B2
(45) Date of Patent: *Jan. 28, 2025

(54) MECHANISMS FOR FORMING FinFET DEVICE

(71) Applicant: Taiwan Semiconductor Manufacturing Co., Ltd., Hsinchu (TW)

(72) Inventors: Che-Cheng Chang, New Taipei (TW); Chang-Yin Chen, Taipei (TW); Jr-Jung Lin, Hsinchu (TW); Chih-Han Lin, Hsinchu (TW); Yung-Jung Chang, Cyonglin Township (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 177 days.

This patent is subject to a terminal disclaimer.

(21) Appl. No.: 17/808,709

(22) Filed: Jun. 24, 2022

(65) Prior Publication Data

US 2022/0328356 A1   Oct. 13, 2022

Related U.S. Application Data

(60) Continuation of application No. 16/889,236, filed on Jun. 1, 2020, now Pat. No. 11,380,590, which is a
(Continued)

(51) Int. Cl.
*H01L 21/8234* (2006.01)
*H01L 21/3213* (2006.01)
(Continued)

(52) U.S. Cl.
CPC .............. *H01L 21/823431* (2013.01); *H01L 21/32137* (2013.01); *H01L 21/845* (2013.01);
(Continued)

(58) Field of Classification Search
CPC ..... H01L 21/823431; H01L 21/823821; H01L 21/845; H01L 21/3213–32139;
(Continued)

(56) References Cited

U.S. PATENT DOCUMENTS 6,506,642 B1   1/2003   Luning et al.
10,672,796 B2   6/2020   Chang et al.
(Continued)

FOREIGN PATENT DOCUMENTS

CN   103208519 A   7/2013

*Primary Examiner* — Shaun M Campbell
*Assistant Examiner* — Aneta B Cieslewicz
(74) *Attorney, Agent, or Firm* — Slater Matsil, LLP

(57) ABSTRACT

Embodiments of mechanisms for forming a semiconductor device are provided. The semiconductor device includes a substrate. The semiconductor device also includes a first fin and a second fin over the substrate. The semiconductor device further includes a first gate electrode and a second gate electrode traversing over the first fin and the second fin, respectively. In addition, the semiconductor device includes a gate dielectric layer between the first fin and the first gate electrode and between the second fin and the second gate electrode. Further, the semiconductor device includes a dummy gate electrode over the substrate, and the dummy gate electrode is between the first gate electrode and the second gate electrode. An upper portion of the dummy gate electrode is wider than a lower portion of the dummy gate electrode.

20 Claims, 17 Drawing Sheets

Related U.S. Application Data continuation of application No. 15/986,549, filed on May 22, 2018, now Pat. No. 10,672,796, which is a division of application No. 14/067,424, filed on Oct. 30, 2013, now Pat. No. 9,991,285.

(51) Int. Cl.

| | | |
|---|---|---|
| *H01L 21/8238* | (2006.01) | |
| *H01L 21/84* | (2006.01) | |
| *H01L 27/088* | (2006.01) | |
| *H01L 27/12* | (2006.01) | |
| *H01L 29/78* | (2006.01) | |

(52) U.S. Cl.
CPC ...... *H01L 27/0886* (2013.01); *H01L 27/1211* (2013.01); *H01L 29/7831* (2013.01); *H01L 29/785* (2013.01); *H01L 21/823821* (2013.01)

(58) Field of Classification Search
CPC .......................... H01L 21/28008–28264; H01L 21/7624–76291; H01L 27/0886; H01L 27/0924; H01L 27/1211; H01L 29/41791; H01L 29/66795–66818; H01L 29/785–7856; H01L 29/66545

See application file for complete search history.

(56) References Cited

U.S. PATENT DOCUMENTS

| | | |
|---|---|---|
| 2003/0049876 A1 | 3/2003 | Mori et al. |
| 2007/0134922 A1 | 6/2007 | Mori et al. |
| 2007/0163995 A1 | 7/2007 | Sugimoto et al. |
| 2008/0296667 A1 | 12/2008 | Mikasa |
| 2010/0301421 A1 | 12/2010 | Kronholz et al. |
| 2013/0015524 A1 | 1/2013 | Hsu et al. |
| 2013/0059435 A1 | 3/2013 | Yang et al. |
| 2013/0181300 A1 | 7/2013 | Mor et al. |
| 2013/0187237 A1 | 7/2013 | Yu et al. |
| 2013/0228876 A1 | 9/2013 | Mor et al. |
| 2013/0292777 A1 | 11/2013 | Liaw |
| 2014/0001559 A1 | 1/2014 | Lin et al. |
| 2014/0349473 A1* | 11/2014 | Lin ............... H01L 29/6681 438/585 |
| 2014/0374830 A1 | 12/2014 | Jeong et al. |

* cited by examiner

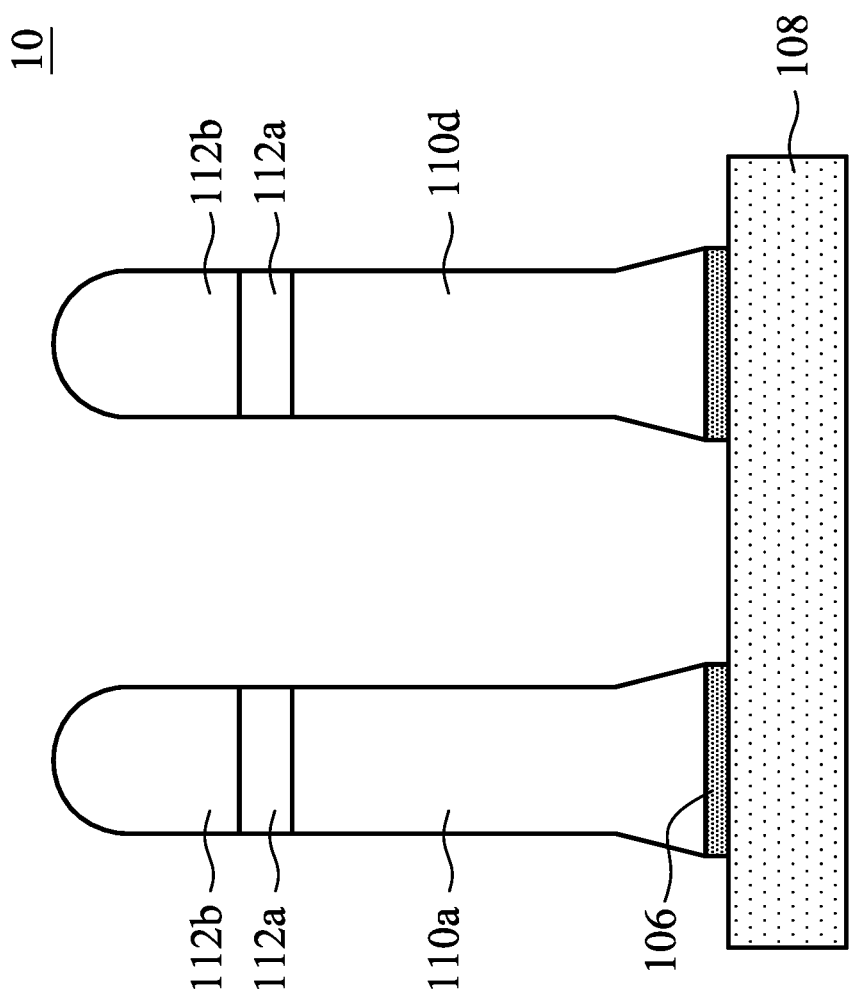

MECHANISMS FOR FORMING FinFET DEVICE

PRIORITY CLAIM AND CROSS-REFERENCE

This application is a continuation of U.S. application Ser. No. 16/889,236, filed Jun. 1, 2020, entitled "Mechanisms for Forming FinFET Device," which is a continuation of U.S. application Ser. No. 15/986,549, filed May 22, 2018, now U.S. Pat. No. 10,672,796 issued Jun. 2, 2020, which is a divisional of U.S. application Ser. No. 14/067,424, filed on Oct. 30, 2013 and entitled "Mechanisms for Forming FinFET Device," now U.S. Pat. No. 9,991,285 issued on Jun. 5, 2018, which applications are hereby incorporated herein by reference in their entireties.

BACKGROUND

Semiconductor devices are used in a variety of electronic applications, such as personal computers, cell phones, digital cameras, and other electronic equipment. The semiconductor devices are fabricated by sequentially depositing insulating or dielectric layers, conductive layers, and semiconductor layers over a semiconductor substrate, and patterning the various material layers using lithography and etching processes to form circuit components and elements on the semiconductor substrate.

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). The FinFET is fabricated with a thin vertical "fin" (or fin structure) extending from a substrate. The channel of the FinFET is formed in this vertical fin. A gate is provided over the fin. Advantages of the FinFET may include reducing the short channel effect and higher current flow.

However, since the feature sizes continue to decrease, fabrication processes continue to become more difficult to perform. Therefore, it is a challenge to form a reliable semiconductor device including the FinFET.

BRIEF DESCRIPTION OF THE DRAWINGS

For a more complete understanding of the embodiments, and the advantages thereof, reference is now made to the following descriptions taken in conjunction with the accompanying drawings.

FIG. 2B is a cross-sectional view of the semiconductor device taken along the line b-b of FIG. 2A, in accordance with some embodiments.

DETAILED DESCRIPTION OF ILLUSTRATIVE EMBODIMENTS

The making and using of the embodiments of the disclosure are discussed in detail below. It should be appreciated, however, that the embodiments can be embodied in a wide variety of specific contexts. The specific embodiments discussed are merely illustrative, and do not limit the scope of the disclosure.

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact. Some variations of the embodiments are described. Throughout the various views and illustrative embodiments, like reference numbers are used to designate like elements.

Figure 1:
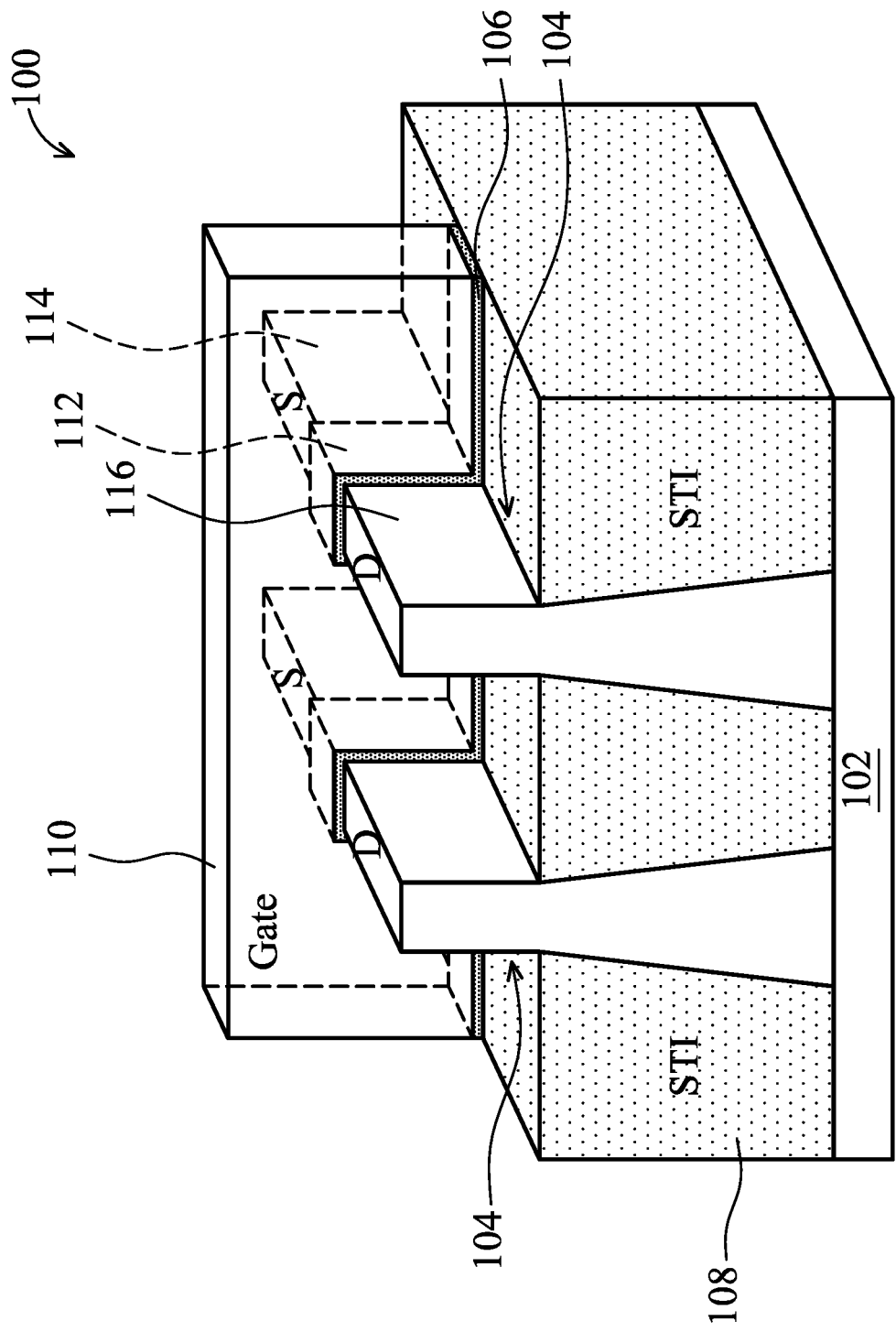
FIG. 1 is a perspective view of a fin field effect transistor (FinFET) device, in accordance with some embodiments.

Referring to FIG. 1, illustrated is a perspective view of a fin field effect transistor (FinFET) device 100, in accordance with some embodiments. The FinFET device 100 includes a substrate 102. The substrate 102 includes a semiconductor substrate. In some embodiments, the substrate 102 is a bulk semiconductor substrate, such as a silicon wafer. The substrate 102 may be silicon in a crystalline structure. In some other embodiments, the substrate 102 includes other elementary semiconductors such as germanium, or it includes a compound semiconductor. The compound semiconductor may include silicon carbide, gallium arsenide, indium arsenide, indium phosphide, and/or the like. In some embodiments, the substrate 102 includes a semiconductor-on-insulator (SOI) substrate. The SOI substrate may be fabricated using a separation by implantation of oxygen (SIMOX) process, wafer bonding process, and/or other suitable methods.

The FinFET device 100 also includes one or more fin structures 104 (e.g., Si fins) that extend from the substrate 102. The fin structures 104 may optionally include germanium. The fin structures 104 may be formed by using suitable processes such as photolithography and etching processes. In some embodiments, the fin structures 104 are etched from the substrate 102 using dry etch or plasma processes. Isolation structures 108, such as shallow trench isolation (STI) structures, are formed to surround the fin structures 104. In some embodiments, a lower portion of the fin structure 104 is surrounded by the isolation structure 108, and an upper portion of the fin structure 104 protrudes from the isolation structure 108, as shown in FIG. 1.

The FinFET device 100 further includes a gate structure including a gate electrode 110 and a gate dielectric layer 106. The gate structure is formed over a central portion of the fin structures 104. In some embodiments, multiple gate structures are formed over the fin structures 104. Numerous other layers may also be present in the gate structures, for example, capping layers, interface layers, spacer elements, and/or other suitable features.

In some embodiments, the gate dielectric layer 106 includes an interfacial layer (not shown) adjacent to the fin structures 104. The interfacial layer may include silicon oxide. The gate dielectric layer 106 may include other dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

The gate electrode 110 may include polysilicon or metal including materials, such as TiN, TaN·NiSi, CoSi, Mo, Cu, W, Al, Co, Zr, Pt, other suitable materials, or combinations thereof. The gate electrode 110 may be formed in a gate last process (or gate replacement process).

Each of the fin structures 104 includes a channel region 112 surrounded or wrapped by the gate electrode 110 and the gate dielectric layer 106. The fin structures 104 may be doped to provide a suitable channel for an N-type FinFET (NMOS device) or P-type FinFET (PMOS device). The fin structures 104 may be doped using a suitable process, such as an ion implantation process, diffusion process, annealing process, other applicable processes, or combinations thereof. Each of the fin structures 104 includes a source region 114 and a drain region 116 between the channel region 112. The FinFET device 100 may be a device included in a microprocessor, memory cell (e.g., SRAM), and/or other integrated circuits.

Figure 2A:
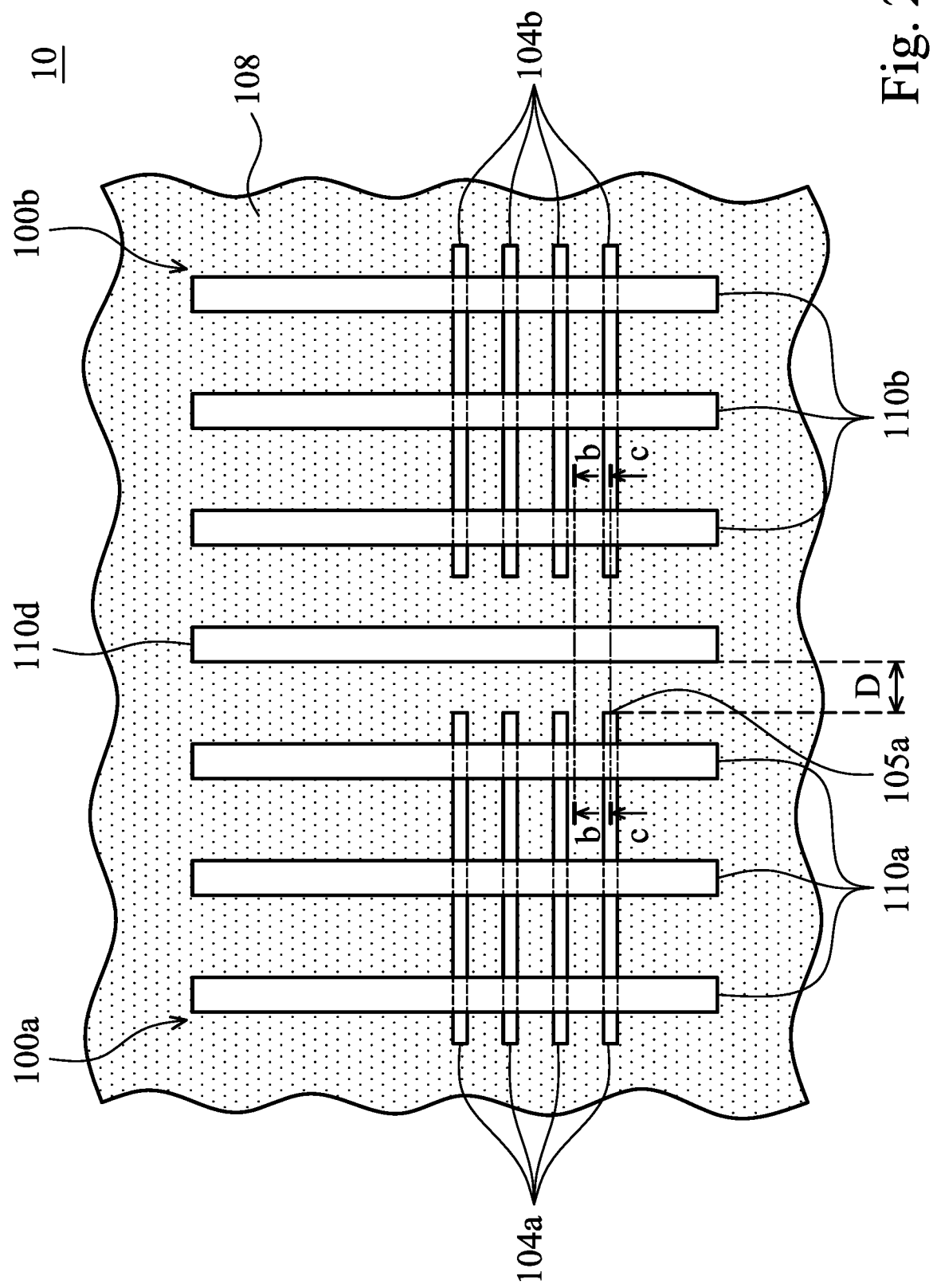
FIG. 2A is a top view showing the layout of a semiconductor device that includes two or more FinFET devices, in accordance with some embodiments.

As mentioned above, a FinFET device may include multiple gate structures and multiple fins. FIG. 2A is a top view showing the layout of a semiconductor device 10 that includes two or more FinFET devices, in accordance with some embodiments. As shown in FIG. 2A, a portion of the semiconductor device 10 is illustrated. The semiconductor device 10 includes FinFET devices 100a and 100b. The isolation structures 108, surrounding the FinFET devices 100a and 100b, electrically isolate the FinFET devices 100a and 100b from each other.

As shown in FIG. 2A, the FinFET devices 100a and 100b include multiple fins and multiple gate electrodes, in accordance with some embodiments. The FinFET device 100a includes multiple fins 104a and multiple gate electrodes 110a traversing over the fins 104a. The fins 104a may be substantially parallel to each other. The gate electrode 110a may also be parallel to each other and substantially perpendicular to the fins 104a. Similarly, the FinFET device 100b also includes multiple fins 104b and multiple gate electrodes 110b.

A dummy gate electrode 110d is between the FinFET devices 100a and 100b, in accordance with some embodiments. The dummy gate electrode 110d may be used to reduce the pattern-loading effects (or iso-dense effects). The dummy gate electrode 110d is designed to be not electrically connected to the fins 104a and 104b or to the gate electrodes 110a and 110b. As shown in FIG. 2A, each of the fins 104a has a fin terminal 105a near the dummy gate electrode 110d. The dummy gate electrode 110d is separated from the fin terminal 105a by a spacing D. Since the integration density of electronic components continues to increase by continual reductions in minimum feature size, the spacing D between the fin terminal 105a and the dummy gate electrode 110d is getting smaller. In some embodiments, the length of the spacing D is in a range from about 10 nm to about 120-nm.

Figure 2C:
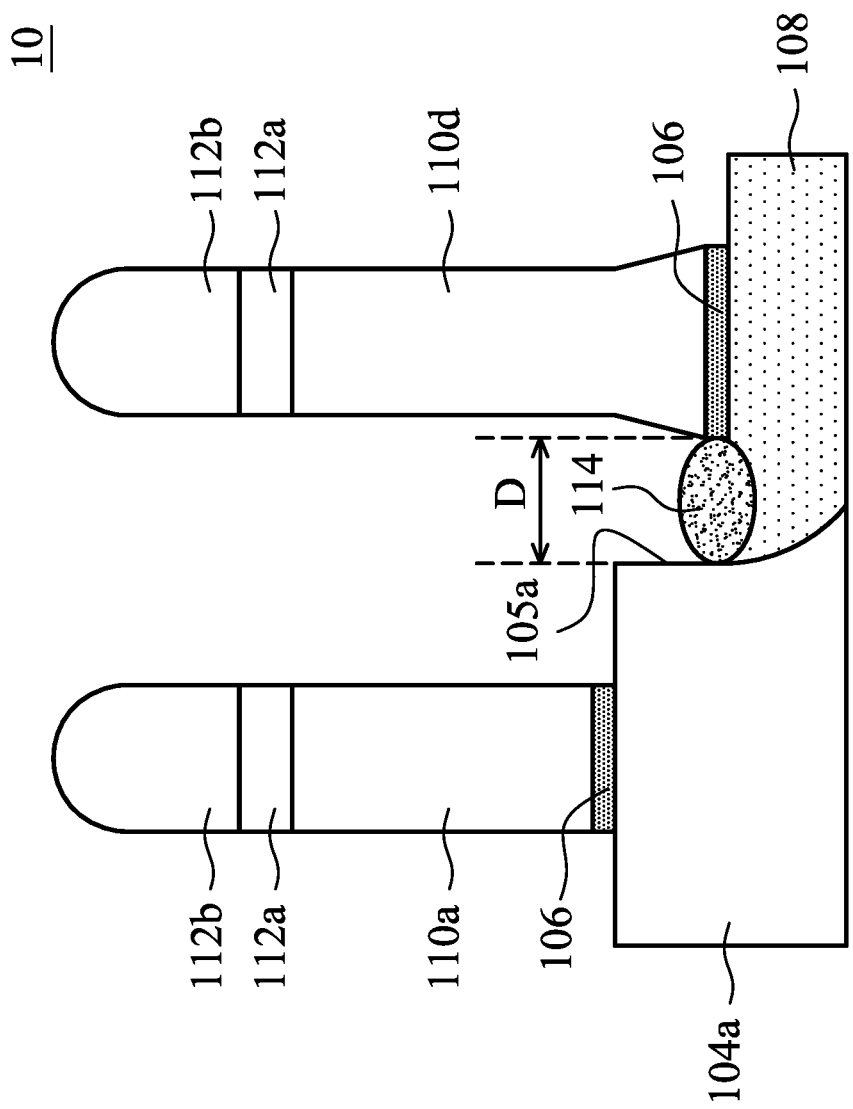
FIG. 2C is a cross-sectional view of the semiconductor device taken along the line c-c of FIG. 2A, in accordance with some embodiments.

FIG. 2B is a cross-sectional view of the semiconductor device 10 taken along the line b-b of FIG. 2A, in accordance with some embodiments. FIG. 2C is a cross-sectional view of the semiconductor device 10 taken along the line c-c of FIG. 2A, in accordance with some embodiments. In some embodiments, the gate dielectric layer 106 and a gate electrode layer (e.g., a polysilicon layer) are sequentially deposited over the isolation structures 108 and the fins (including the fins 104a and 104b). Afterwards, patterned hard masks 112a and 112b are formed over the gate electrode layer. The gate electrode layer and the gate dielectric layer 106 are then partially removed using etching processes. As a result, a number of gate stacks are formed. The gate stacks include the gate dielectric layer 106 and the gate electrodes 110a and 110b. The dummy gate electrode 110d is also formed over the isolation structure 108.

As shown in FIG. 2B, the profiles of the gate electrode 110a and the dummy gate electrode 110d are substantially the same in some embodiments. In some other embodiments, the profile of the gate electrode 110a is more tapered than that of the dummy gate electrode 110d.

However, because the spacing D is small, a residue 114 may be left between the dummy gate electrode 110d and the fin terminal 105a of the fin 104a. The residue may come from the material of the gate electrode layer not being fully removed, or being re-deposited during the etching process. In some embodiments, the residue 114 is in direct contact with the dummy gate electrode 110d and the fin 104a. In some embodiments, the residue 114 is also formed between and in contact with the dummy gate electrode 110d and the fin 104b (see FIG. 2A). As a result, a short circuiting may be formed between the fins 104a and 104b through the dummy gate electrode 110d and the residue 114, which leads to a reduction of yield.

As the spacing D continues to shrink, the problems mentioned above are exacerbated in some embodiments. Therefore, it is desirable to find alternative mechanisms for forming a semiconductor device having FinFET devices to reduce or resolve the problems mentioned above.

Figure 3A:
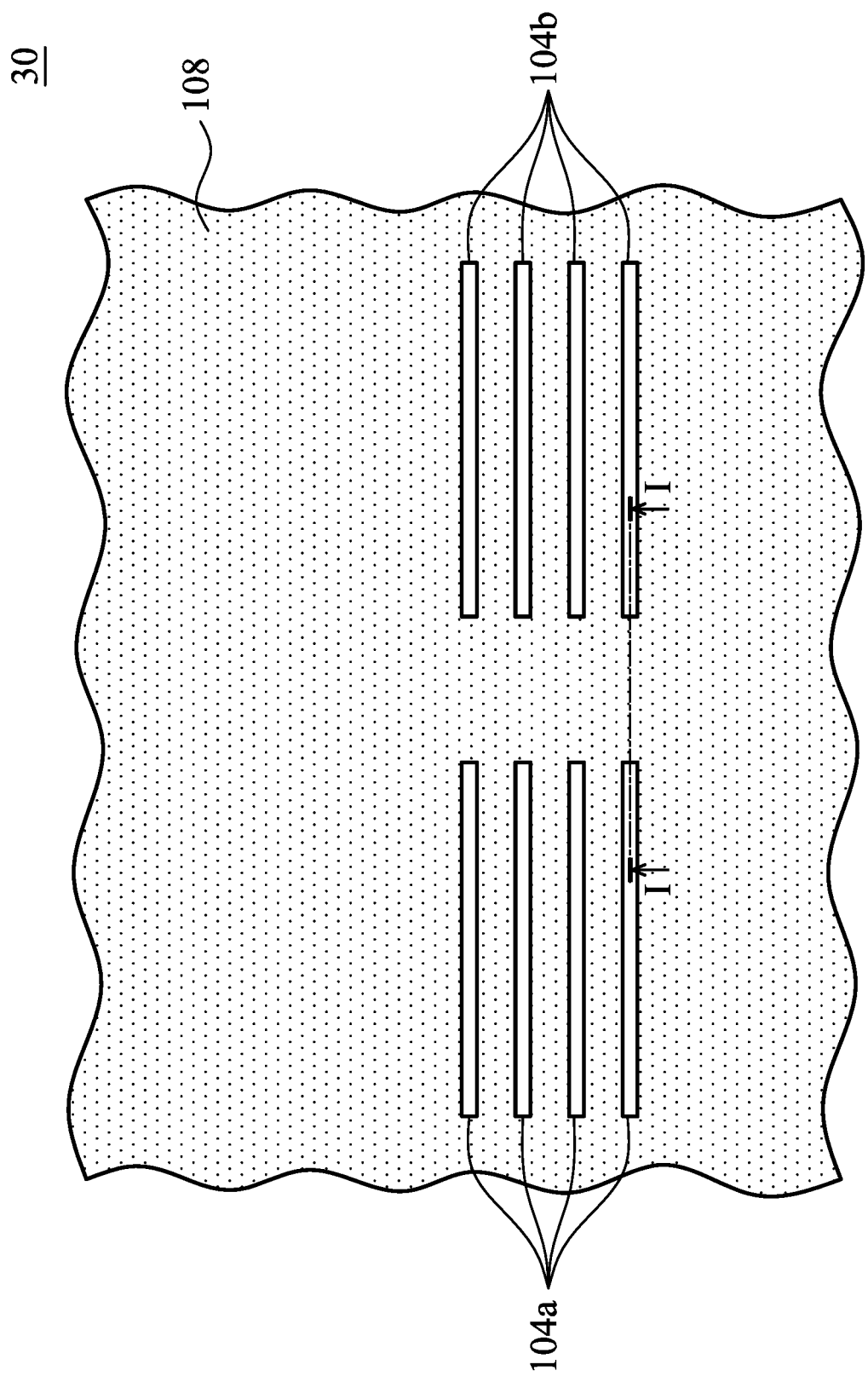
FIGS. 3A-3C are top views of various stages of a process for forming a semiconductor device, in accordance with some embodiments.
Figure 3B:
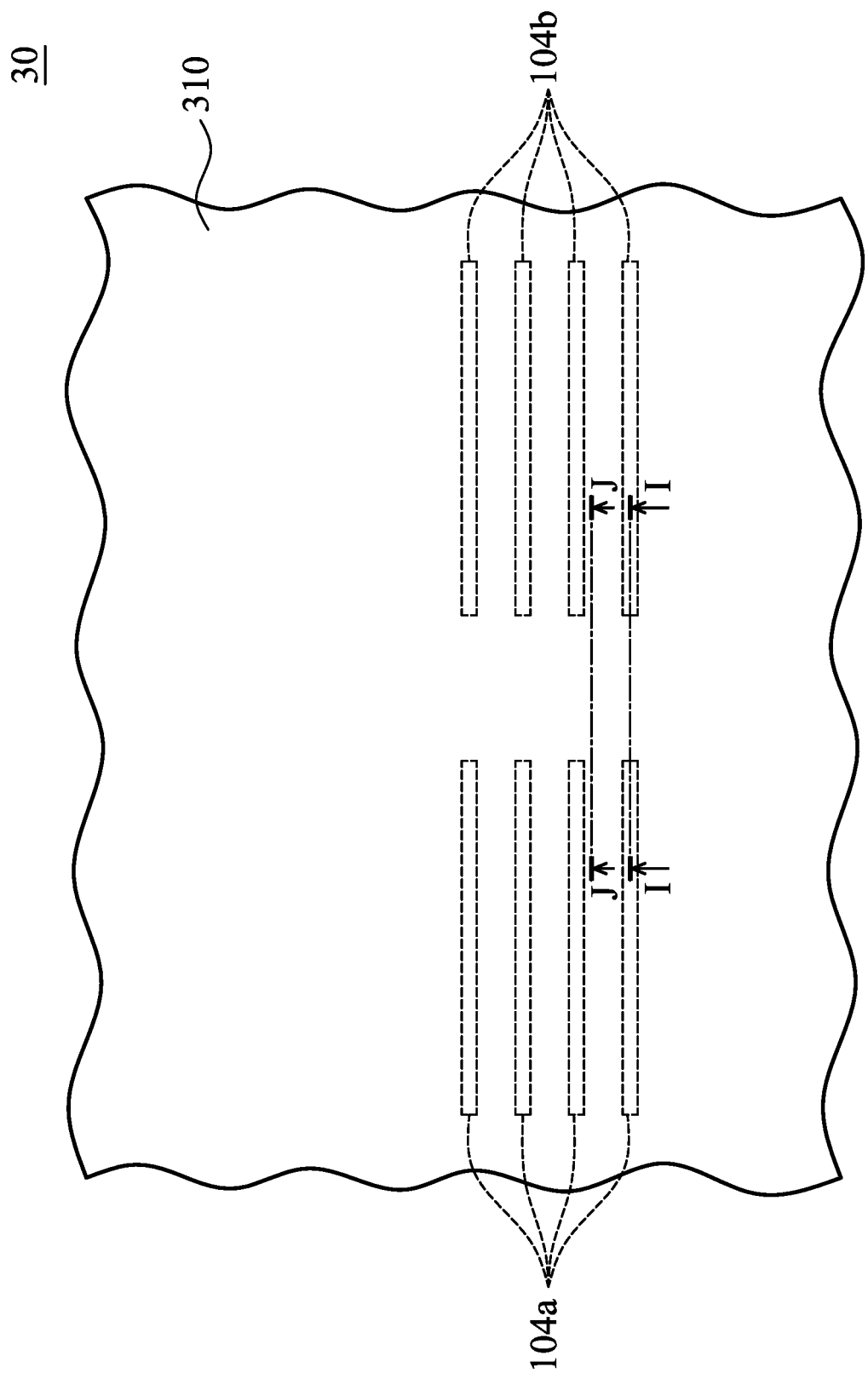
Figure 3C:
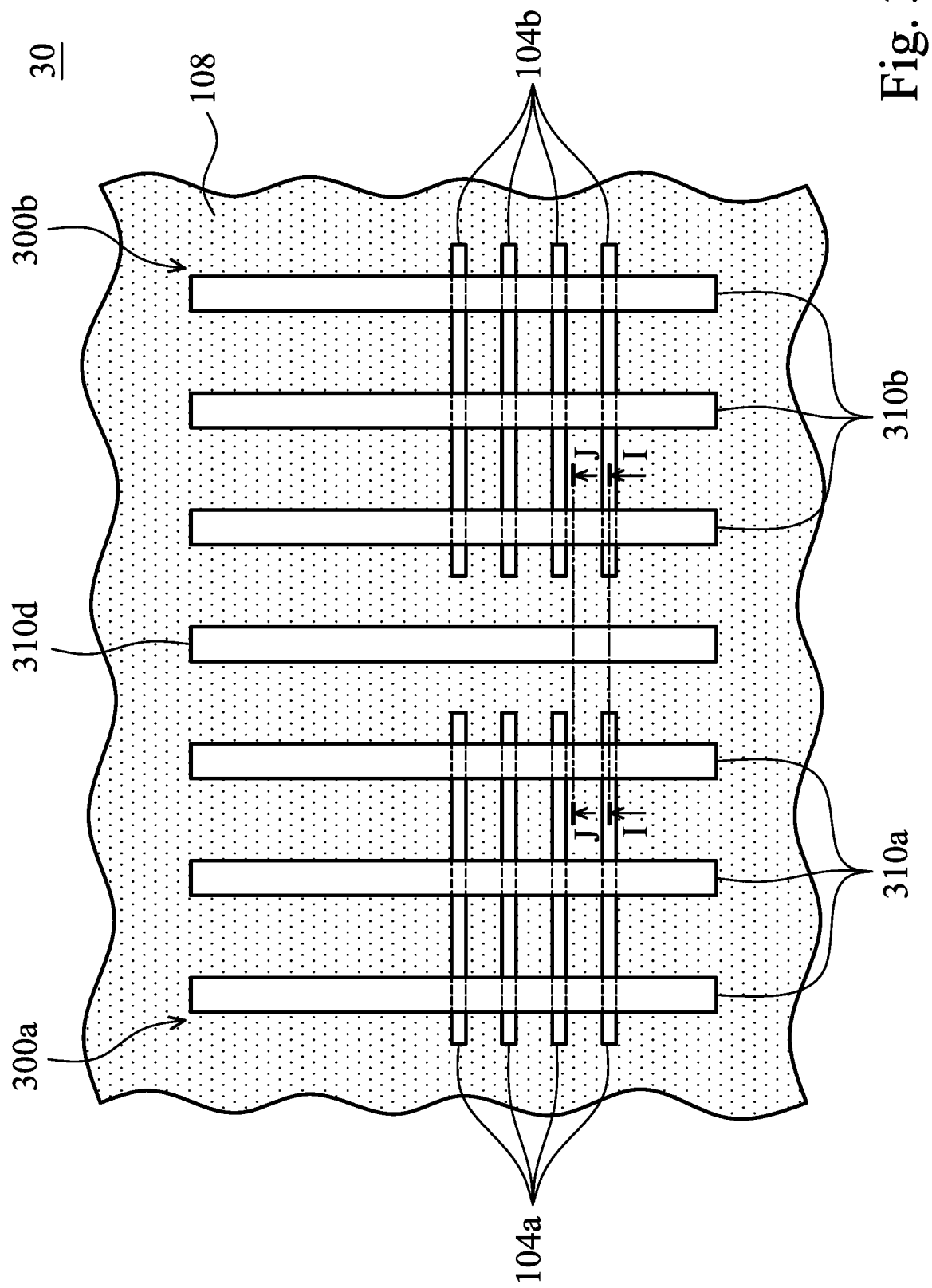

FIGS. 3A-3C are top views of various stages of a process for forming a semiconductor device 30, in accordance with some embodiments. FIGS. 4A-4D are cross-sectional views (taken along the line I-I of FIGS. 3A-3C) of various stages of a process for forming the semiconductor device 30, in accordance with some embodiments. FIGS. 5A-5D are cross-sectional views (taken along the line J-J of FIGS. 3B-3C) of various stages of a process for forming the semiconductor device 30, in accordance with some embodiments.

Figure 4A:
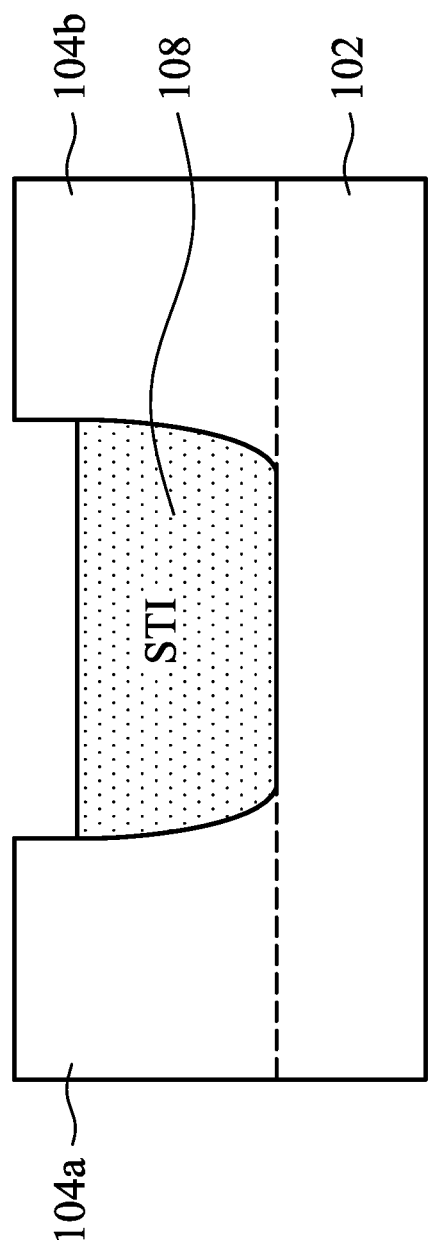
FIGS. 4A-4D are cross-sectional views of various stages of a process for forming a semiconductor device, in accordance with some embodiments.

As shown in FIGS. 3A and 4A, the fins 104a and 104b are formed over the substrate 102, in accordance with some embodiments. In some embodiments, the substrate 102 is etched to form the fins 104a and 104b by first depositing and patterning a hard mask layer (not shown) on the substrate 102. The hard mask layer forms a pattern covering a portion of the substrate 102. Afterwards, the substrate 102 is etched to form trenches between the regions covered by the hard mask layer. As a result, the fins 104a and 104b are formed between the trenches.

The trenches are formed into the isolation structures 108 to surround the fins 104a and 104b, as shown in FIGS. 3A and 4A in accordance with some embodiments. A dielectric material (e.g., silicon oxide) is deposited into the trenches and covers the fins 104a and 104b. Afterwards, the dielectric material is planarized down to the top surfaces of the fins or the hard mask layer, and then the dielectric material is etched to a level below the top surfaces of the fins 104a and 104b. As a result, upper portions of the fins 104a and 104b protrude above the isolation structures 108, and lower portions of the fins 104a and 104b are surrounded and covered by the isolation structures 108, as shown in FIG. 4A.

Alternatively, the isolation structures 108 are formed first over the substrate 102. Trenches between the isolation structures 108 are formed to expose the substrate 102. A semiconductor material, such as silicon, silicon germanium, or other applicable materials, is then grown in the trenches to form the fins 104a and 104b by using, for example, an epitaxial process. After the fins 104a and 104b are grown to have the desired height, the isolation structures 108 are etched down to a level below the top surfaces of the fins 104a and 104b. As a result, portions of the fins 104a and 104b protrude above the isolation structures 108, as shown in FIG. 4A.

Figure 5A:
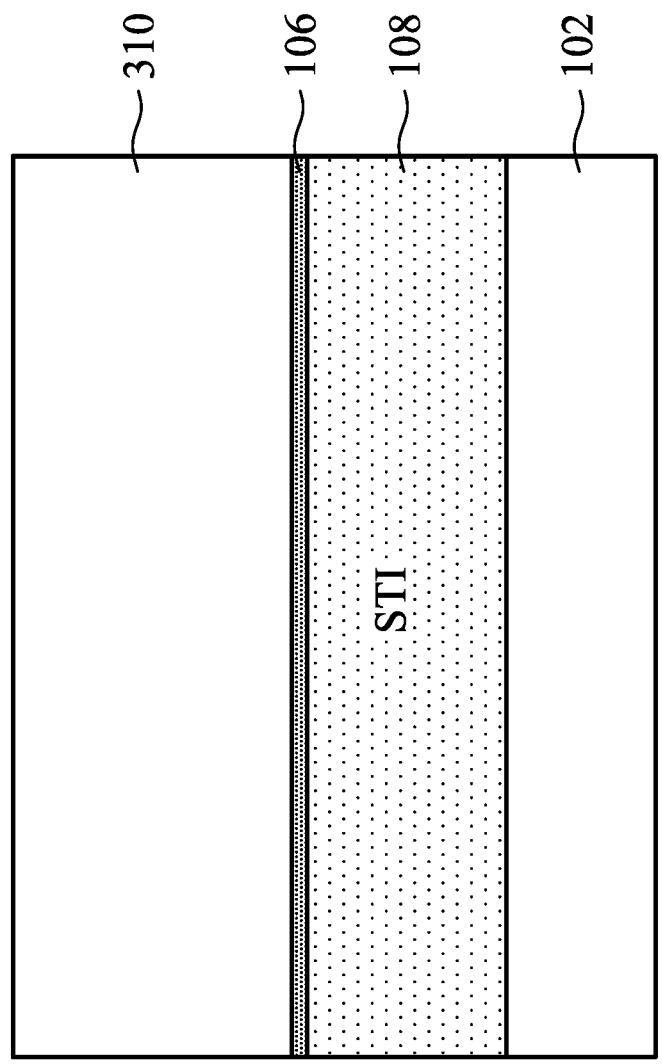
FIGS. 5A-5D are cross-sectional views of various stages of a process for forming a semiconductor device, in accordance with some embodiments.

Referring to FIGS. 3B and 5A, the gate dielectric layer 106 and a gate electrode layer 310 are formed over the fins 104a and 104b and the isolation structures 108, in accordance with some embodiments. The gate electrode layer 310 may be made of polysilicon in some embodiments. The gate electrode layer 310 may be deposited using a CVD process or other applicable processes.

Figure 4B:
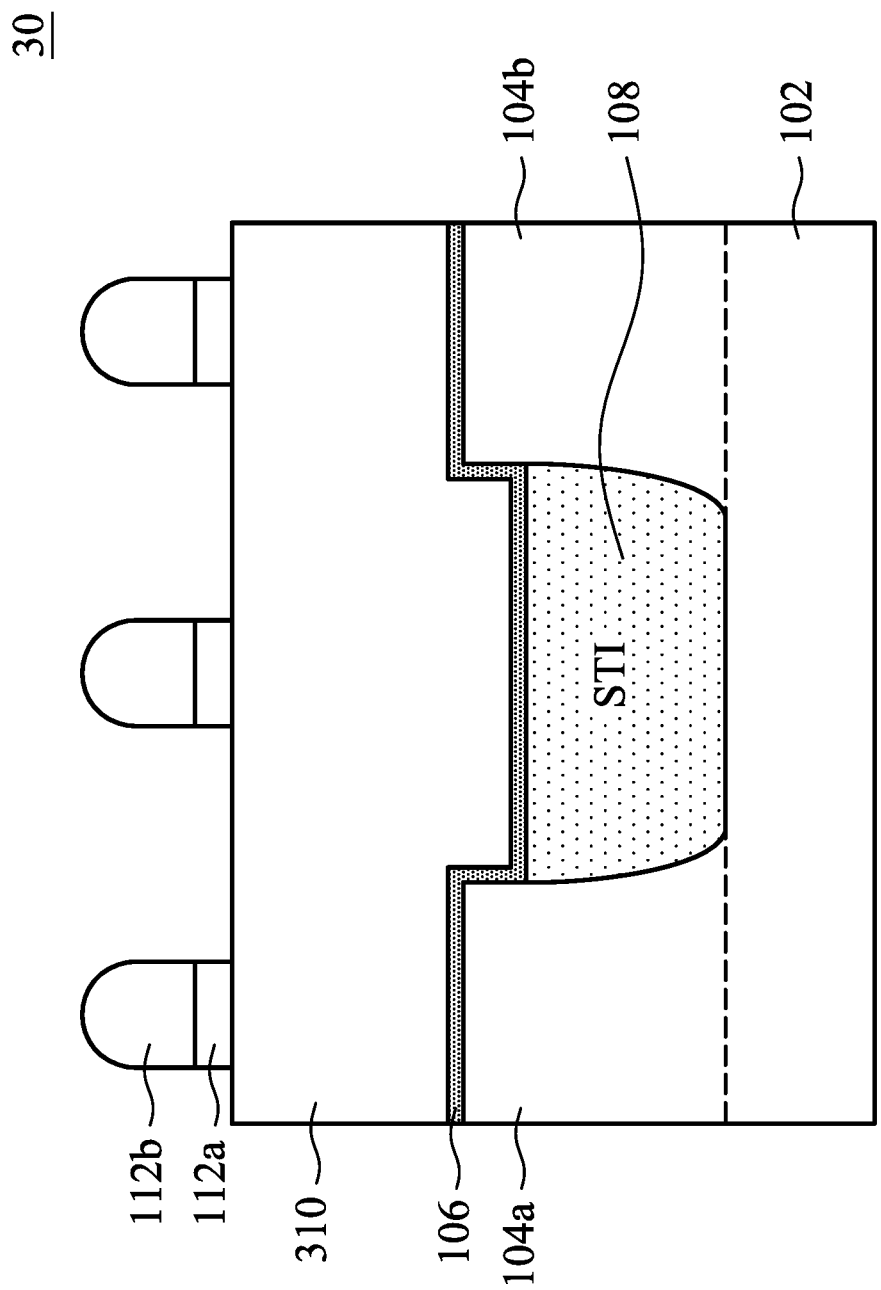
Figure 5B:
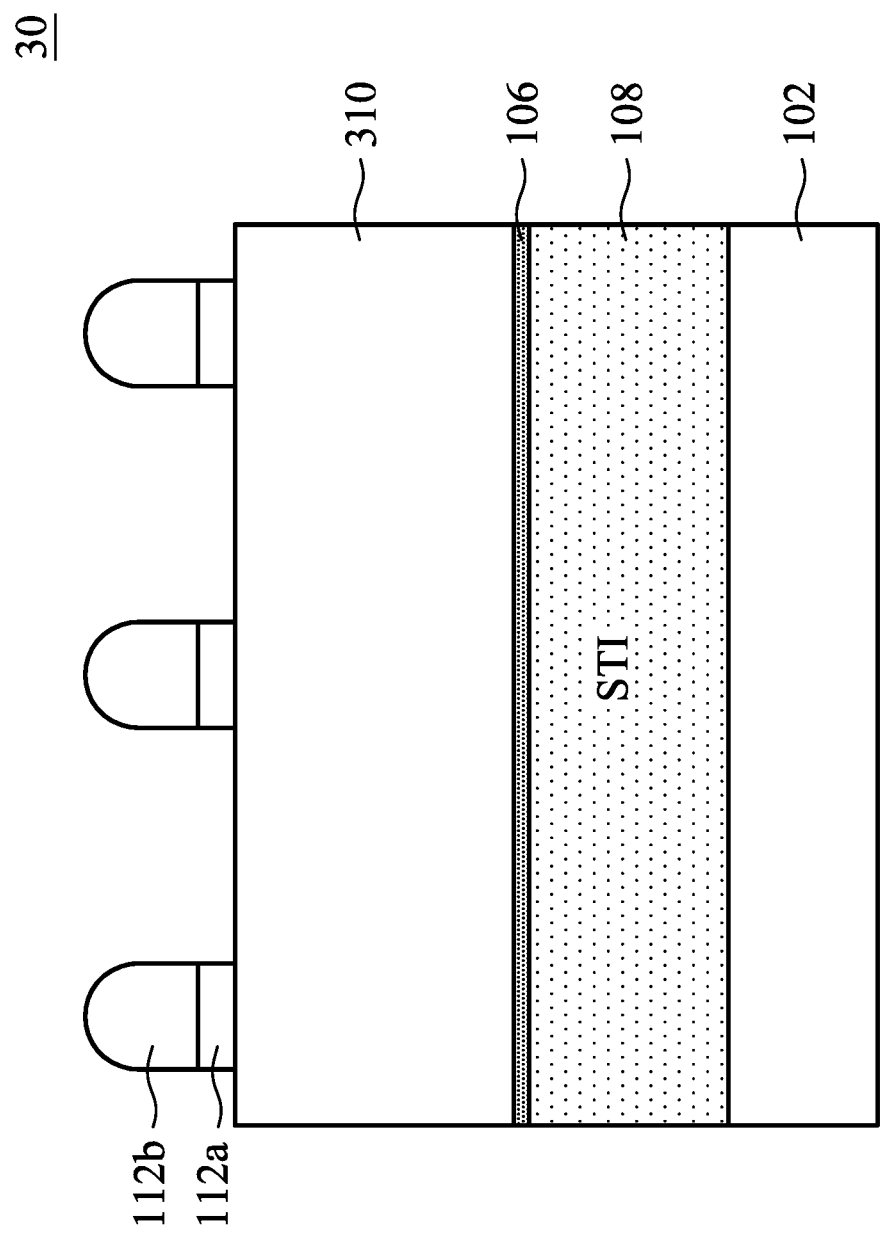

The gate electrode layer 310 and the gate dielectric layer 106 are to be patterned to form gate stacks traversing over the fins 104a and 104b. As shown in FIGS. 4B and 5B, one or more hard masks are formed over the gate electrode layer 310, in accordance with some embodiments. In some embodiments, stacks of hard masks 112a and 112b are formed over the gate electrode layer 310. The hard mask 112a may be made of silicon oxide, silicon nitride, silicon oxynitride, or other applicable materials. The hard mask 112b may be made of silicon oxide, silicon nitride, silicon oxynitride, or other applicable materials. The hard masks 112a and 112b form a pattern covering a portion of the gate electrode layer 310 to facilitate a subsequent patterning process for forming gate electrodes.

Figure 4C:
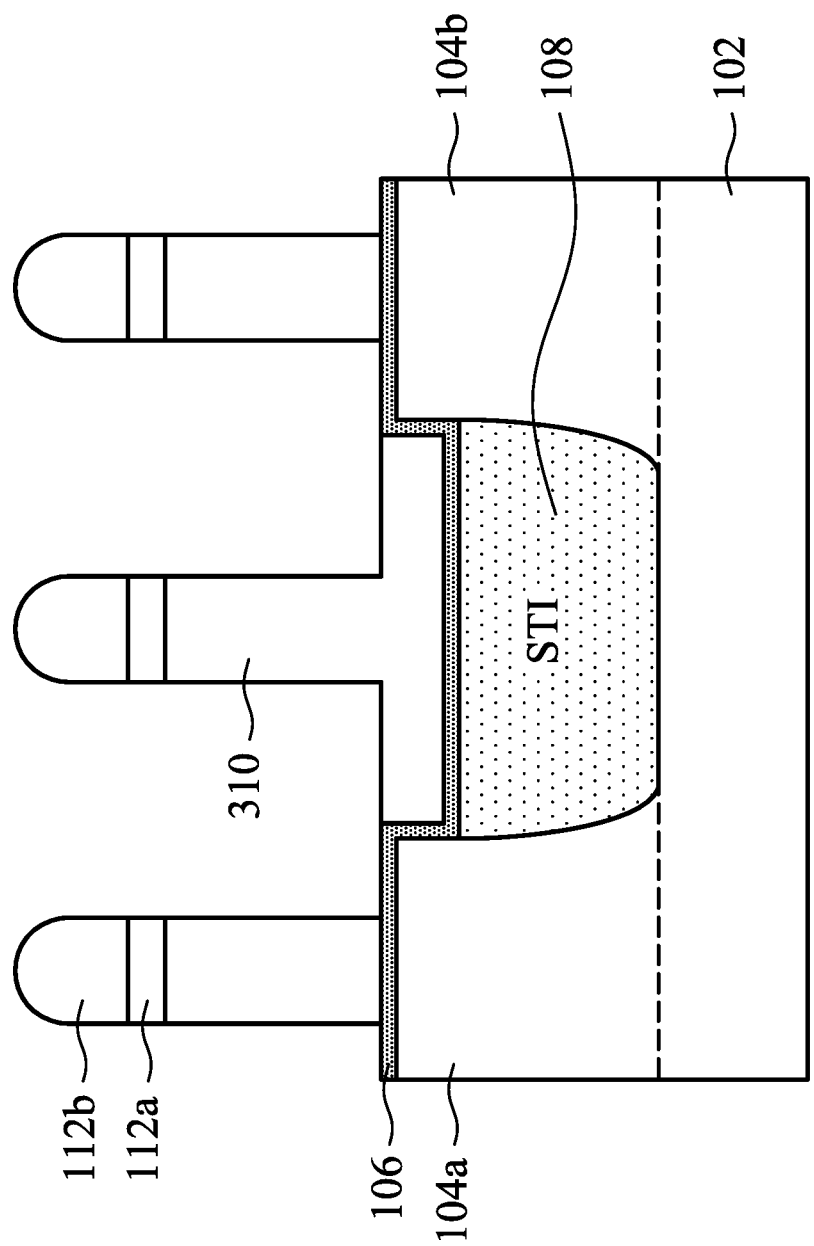
Figure 5C:
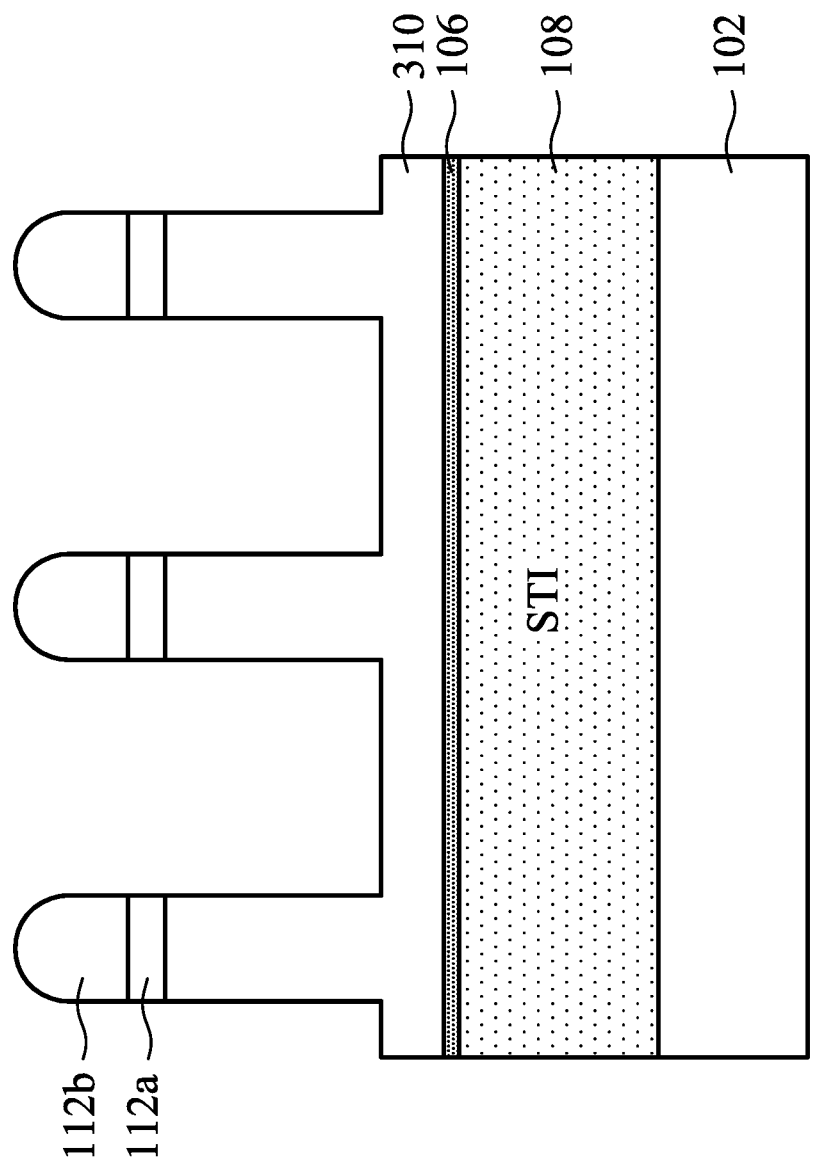

Multiple etching operations are performed to etch the gate electrode layer 310 to form the gate electrodes, in accordance with some embodiments. As shown in FIGS. 4C and 5C, a first etching operation is performed to remove an upper portion of the gate electrode layer 310, in accordance with some embodiments. The upper portion of the gate electrode layer 310 may be above the fins 104a and 104b. For example, the gate electrode layer 310 is partially etched until the gate dielectric layer 106 above the top surfaces of the fins 104a and 104b is exposed.

The first etching operation may be performed in a process chamber. In some embodiments, the etchant used in the first etching operation includes $Cl_2$, $SF_6$, $N_2$, $CF_4$, $CHF_3$, $CH_2F_2$, $N_2H_2$, $O_2$, He, other suitable etchants, or combinations thereof. The pressure of the process chamber may be maintained in a range from about 1 mtorr to about 40 mtorr. The temperature of the first etching operation may be maintained at a temperature ranging from about 10 degrees C. to about 50 degrees C. The power of bias used in the first etching operation may be in a range from about 100 W to about 1000 W.

Figure 4D:
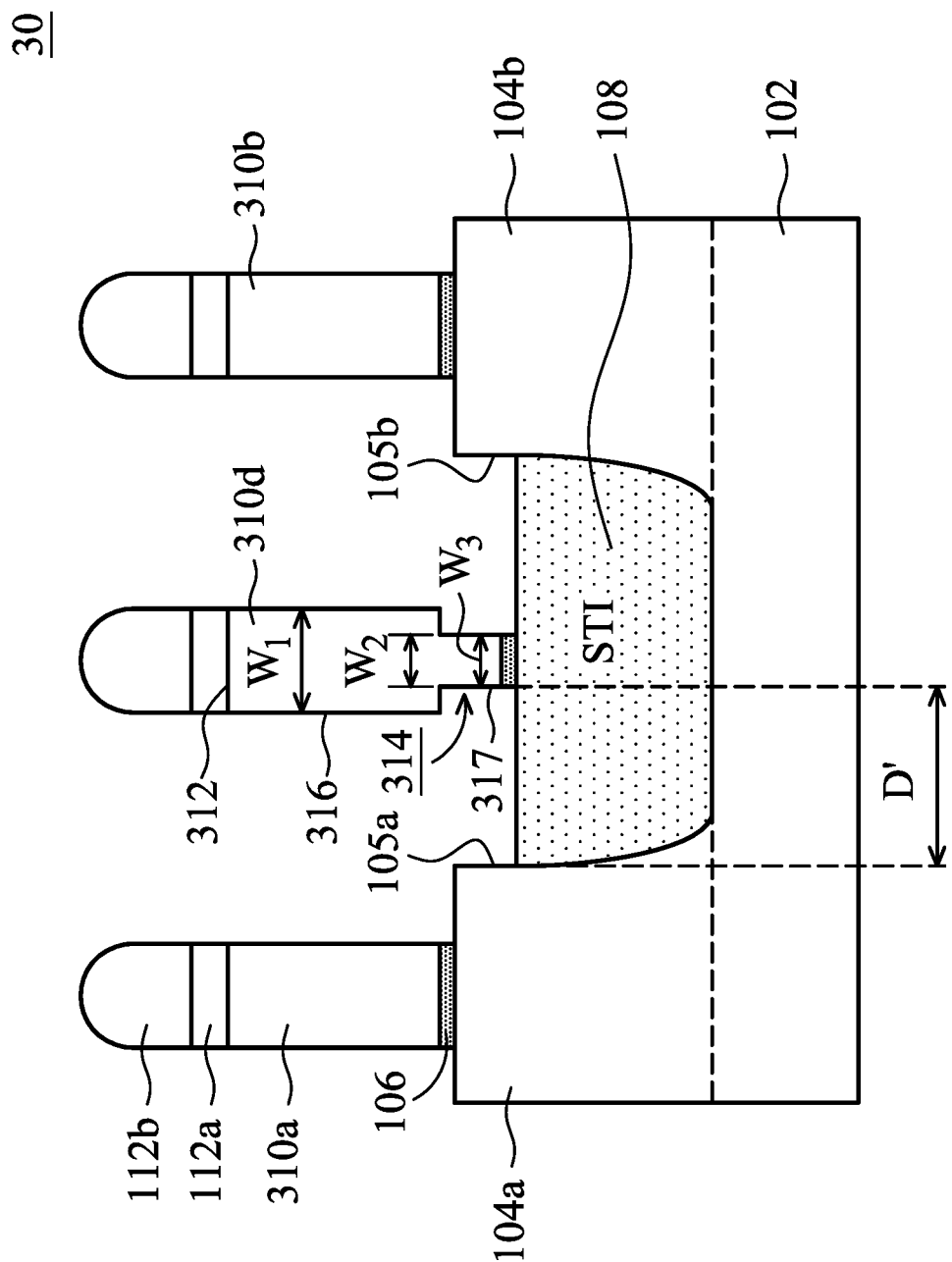
Figure 5D:
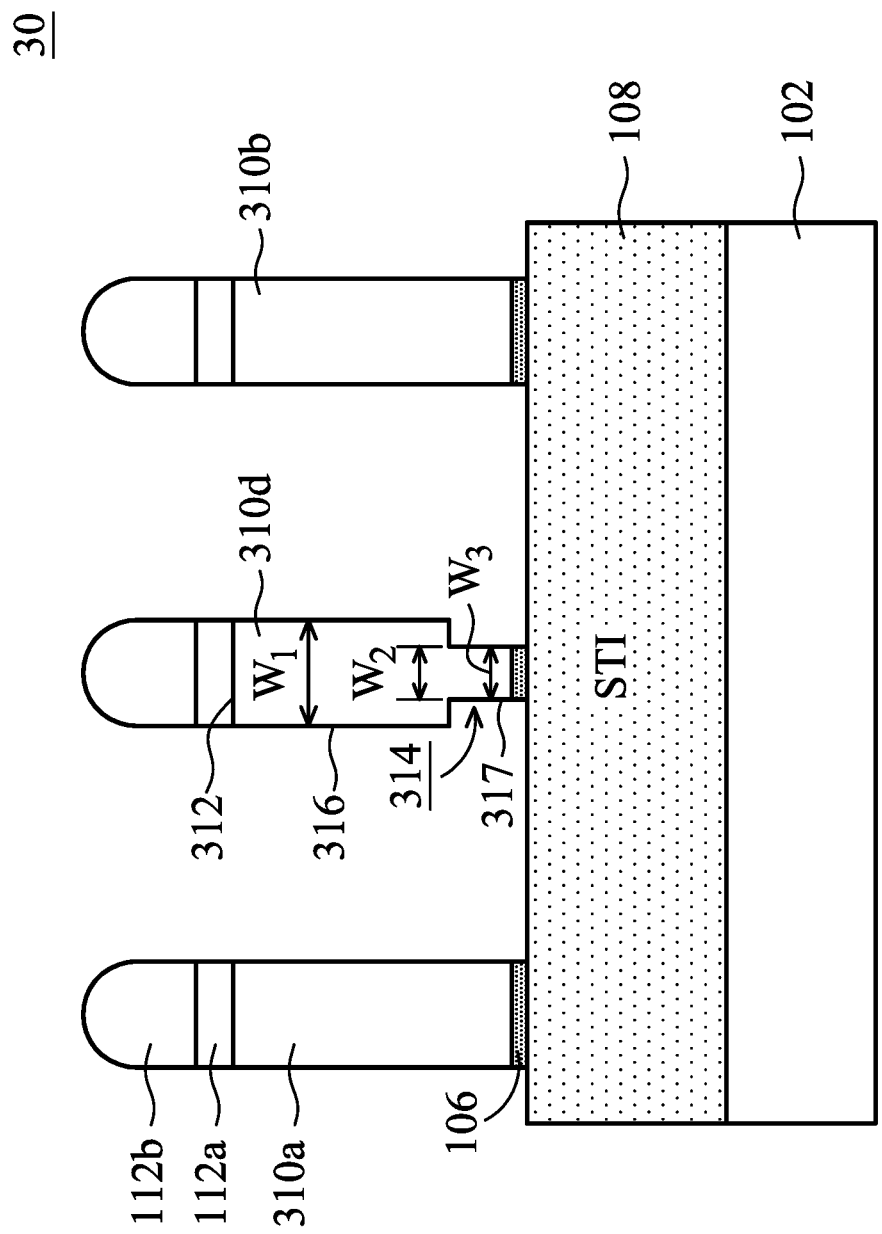

As shown in FIGS. 3C, 4D, and 5D, a second etching operation is performed to partially remove a lower portion of the gate electrode layer 310 to form gate electrodes 310a and 310b, and a dummy gate electrode 310d, in accordance with some embodiments. In some embodiments, the second etching operation and the first etching operation are performed in the same process chamber. The process chamber may be vacuumized to remove the etchant used in the first etching operation before the second etching operation is performed. In some embodiments, a voltage bias is applied to the substrate 102. Therefore, the etchant used in the second etching operation may be attracted to mainly etch the lower portion of the gate electrode layer 310. The upper portion of the gate electrode layer 310 substantially maintains the profile which has been formed in the first etching operation. As a result, the gate electrodes 310a and 310b and the dummy gate electrode 310d are formed.

In some embodiments, the etchant used in the second etching operation includes $Cl_2$, $BCl_3$, $N_2$, $CF_4$, $CHF_3$, $CH_2F_2$, $N_2H_2$, $O_2$, other suitable etchants, or combinations thereof. The pressure of the process chamber may be maintained in a range from about 1 mtorr to about 10 mtorr. The temperature of the second etching operation may be maintained at a temperature ranging from about 10 degrees C. to about 50 degrees C. The power of bias used in the second etching operation may be in a range from about 100 W to about 1000 W.

In the second etching operation, process parameters are adjusted to control the profile of the dummy gate electrode 310d. In some embodiments, various etchants are used in combination in the second etching operation. For example, $Cl_2$ is used as a first etchant, and $CHF_3$ and/or $CH_2F_2$ are/is used as a second etchant. In some embodiments, by tuning the ratio of the amount of the first etchant to the second etchant, the profile of the dummy gate electrode 310d is controlled. For example, by raising the component of the first etchant, the lateral etching rate may be increased. As a result, the bottom portion of the dummy gate electrode 310d may be more recessed. Other process parameters may also be adjusted to control the profile of the dummy gate electrode 310d.

As shown in FIGS. 4D and 5D, a recess 314 is formed at a lower portion of the dummy gate electrode 310d, in accordance with some embodiments. The recess 314 extends from a sidewall 316 of an upper portion of the dummy gate electrode 310d. That is, the dummy gate electrode 310d is recessed at a lower portion of the dummy gate electrode 310d. As shown in FIGS. 4D and 5D, the dummy gate electrode 310d has a width $W_1$ near the top 312 of the dummy gate electrode 310d. The dummy gate electrode 310d also has a width $W_3$ near the substrate 102. The width $W_2$ of the dummy gate electrode 310d is between the widths $W_1$ and $W_3$. The width $W_1$ is larger than the width $W_3$.

The width $W_1$ may be in a range from about 10 nm to about 40 nm. The width $W_3$ may be in a range from about 5 nm to about 30 nm. In some embodiments, the ratio of the width $W_3$ to the width $W_1$ ($W_3/W_1$) is in a range from about ⅛ to about 3. In some embodiments, the width $W_2$ is larger than the width $W_3$ and smaller than the width $W_1$. In some embodiments, the width $W_2$ is substantially equal to the width $W_3$. In some embodiments, the lower portion of the dummy gate electrode 310d has a vertical sidewall 317. The sidewall 317 may be substantially parallel to the sidewall 316 of the upper portion of the dummy gate electrode 310d. In some other embodiments, the sidewall 317 has a curved surface.

As shown in FIG. 4D, the dummy gate electrode 310d shrinks at the lower portion. The spacing D' between the fin terminal 105a of one of the fins 104a and the sidewall 317 of the dummy gate electrode 310d is enlarged when compared to the spacing D of the structure shown in FIG. 2C. In some embodiments, the length of the spacing D' is in a range from about from about 10 nm to about 120 nm. Because the spacing D' is larger, there is less residue formed between the dummy gate electrode 310d and the fin terminal 105a of the fin 104a. Short circuiting formed between the fin 104a and the dummy gate electrode 310d is significantly reduced or prevented. Similarly, the spacing between the dummy gate electrode 310d and a fin terminal 105b of the fin 104b is also enlarged. Short circuiting formed between the fin 104b and the dummy gate electrode 310d is also significantly reduced or prevented. Therefore, the likelihood of short circuiting between the fins 104a and 104b through the dummy gate electrode 310d is reduced, compared with the embodiments illustrated in FIG. 2C.

As shown in FIG. 5D, the gate electrodes 310a and the 310b have vertical sidewalls in some embodiments. There may be no recess formed at the sidewalls of the gate electrodes 310a and 310b. Embodiments of the disclosure are not limited thereto. In some other embodiments, the gate electrodes 310a and 310b have inclined sidewalls. In some embodiments, the bottom profile (the profile of the lower portion) of the dummy gate electrode 310d is more recessed than that of the gate electrode 310a or 310b.

As shown in FIGS. 4D and 5D, the portion of the gate dielectric layer 106 not covered by the gate electrodes 310a and 310b and the dummy gate electrode 310d is removed, in accordance with some embodiments. An etching process may be performed to partially remove the gate dielectric layer 106 so as to expose a portion of the fins 104a and 104b.

Some processes may then be performed to finish the formation of the semiconductor device 30. For example, various processes may be performed to form FinFET devices 300a and 300b of the semiconductor device 30, as shown in FIG. 3C in accordance with some embodiments.

In some embodiments, the fins 104a and 104b not under the gate structure are then doped to form lightly doped drain and source (LDD) regions (not shown). The dopant used depends on the conductivity type of the transistor. The LDD regions may be doped by ion-implantation or by plasma doping where dopants are deposited onto and into the fins 104a and 104b and annealed. Source and drain (S/D) regions (not shown) may also be formed across the gate electrodes 310a and 310b over and between the fins 104a and 104b, similar to the structure shown in FIG. 1. The S/D regions may be formed by an ion-implantation process. Alternatively, a portion of the fins 104a and 104b may be removed and epitaxially re-growing the removed portion under doping condition to form the S/D regions.

In some embodiments, a gate replacement process (or a gate last process) is performed to replace the polysilicon of the gate electrodes 310a and 310b with a metal material, which includes a work function material. In these cases, the gate electrodes 310a and 310b include one or more metal materials. The dummy gate electrode 310d may also be replaced with the metal material. Therefore, the dummy gate electrode 310d may also include one or more metal materials.

Figure 6A:
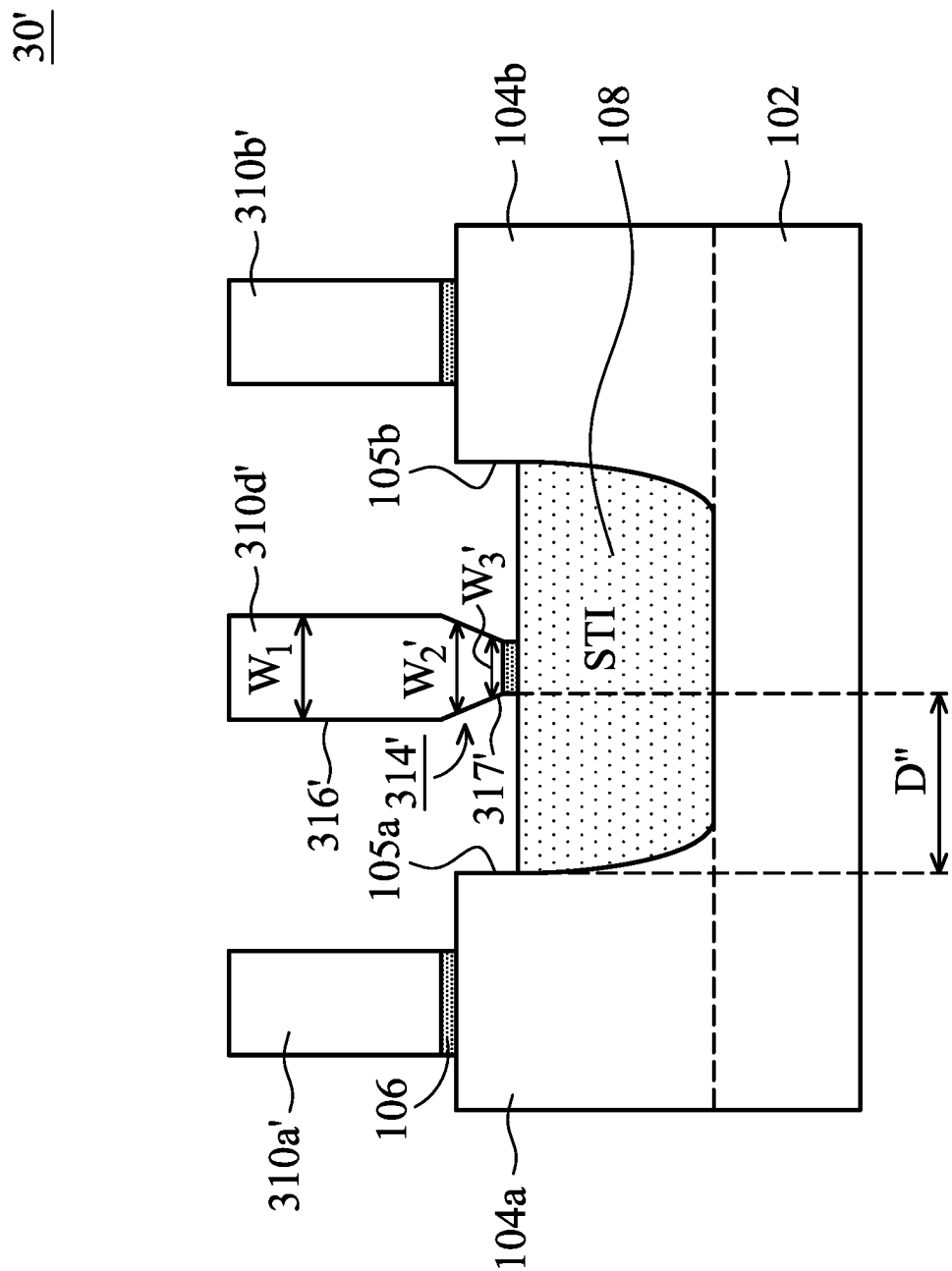
FIGS. 6A-6B are cross-sectional views of a semiconductor device, in accordance with some embodiments.
Figure 6B:
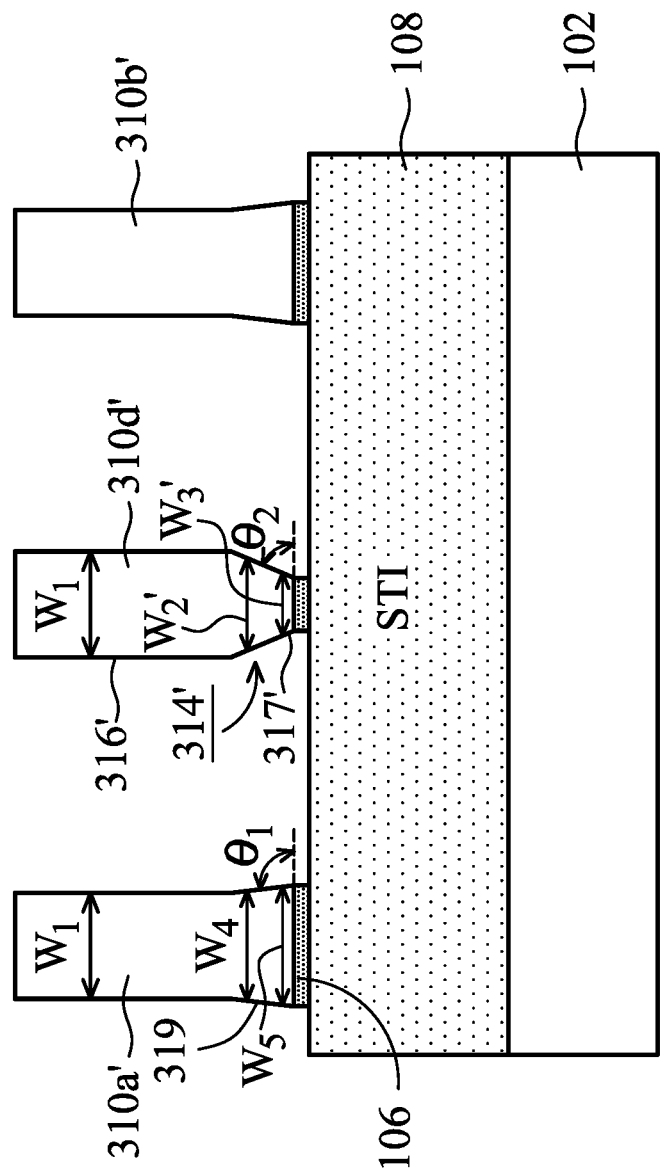

As mentioned above, the profiles of the gate electrodes and the dummy gate electrode may be tuned by adjusting the etching process conditions. FIGS. 6A-6B are cross-sectional views of a semiconductor device 30' similar to the structure shown in FIGS. 4D and 5D, in accordance with some embodiments.

As shown in FIG. 6A, the semiconductor device 30' includes gate electrodes 310a' and 310b' traversing over the fins 104a and 104b. A dummy gate electrode 310d' is between the gate electrodes 310a' and 310b' in some embodiments. The dummy gate electrode 310d' is also between the fins 104a and 104b.

As mentioned above, in the second etching operation, $Cl_2$ is used as a first etchant, and $CHF_3$ and/or $CH_2F_2$ are/is used as a second etchant, in accordance with some embodiments. In some embodiments, more amount of the second etchant is used when compared with the embodiments illustrated in FIG. 4D. As a result, the profile shown in FIG. 6A may be obtained. The lower portion of the dummy gate electrode 310d' has an inclined sidewall 317', and the upper portion of the dummy gate electrode 310d' has a substantially vertical sidewall 316'. A recess 314' is formed from the sidewall 316' and extends inwardly to the center of the dummy gate electrode 310d'.

As shown in FIG. 6A, the dummy gate electrode 310d' gradually shrinks at the lower portion, in accordance with some embodiments. The width $W_2'$ of the dummy gate electrode 310d' is gradually reduced to be the width $W_3'$ at the bottom portion. Therefore, the spacing D" between the fin terminal 105a of one of the fins 104a and the sidewall 317' of the dummy gate electrode 310d' is enlarged when compared to the spacing D of the structure shown in FIG. 2C. Therefore, the likelihood of short circuiting between the fins 104a and 104b through the dummy gate electrode 310d' is reduced, compared with the structure shown in FIG. 2C.

As shown in FIG. 6B, the lower portion of the gate electrode 310a' has an inclined sidewall 319, in accordance with some embodiments. In some embodiments, the width $W_4$ of the gate electrode 310a' gradually increased to be the width $W_5$ at the bottom portion. The width $W_5$ is wider than the width $W_3'$ of the dummy gate electrode 310d'. There is an angle $\theta_1$ between the inclined sidewall 319 and an extending plane of the bottom of the gate electrode 310a'. The angle $\theta_1$ is larger than about 90 degrees in some embodiments. There is an angle 62 between the sidewall 317' and an extending plane of the bottom of the dummy gate electrode 310d'. The angle $\theta_2$ is less than the angle $\theta_1$ and no more than about 90 degrees in some embodiments. In some other embodiments, the angle 61 is less than 90 degrees. In these cases, the angle $\theta_2$ is still less than the angle $\theta_1$ in some embodiments. In some embodiments, the angle $\theta_1$ is larger than the angle $\theta_2$ by an angle difference $(\theta_1-\theta_2)$ ranging from about 0.1 degrees to about 90 degrees. In some other embodiments, the angle $\theta_1$ and the angle $\theta_2$ are the same.

Embodiments of the disclosure have many variations. For example, the sidewalls 317' and/or 319 are not limited to be planar planes. In some other embodiments, one or all of the sidewalls 317' and 319 has a curved surface.

Embodiments of mechanisms for forming a semiconductor device including FinFET devices are provided. By performing an etching process including multiple etching operations to a gate electrode layer, gate electrodes traversing over fins and one or more dummy gate electrodes between the fins are formed. The etching operation is tuned to control the profile of the lower portion of the dummy gate electrode. The dummy gate electrode shrinks at the lower portion. A recess is formed at the lower portion of the dummy gate electrode. Therefore, the distance between the terminals of the fins and the bottom of the dummy gate electrode is enlarged. Short circuiting between the fins and the dummy gate electrode is reduced or prevented. The yield and the reliability of the semiconductor device are therefore improved.

In accordance with some embodiments, a semiconductor device is provided. The semiconductor device includes a substrate. The semiconductor device also includes a first fin and a second fin over the substrate. The semiconductor device further includes a first gate electrode and a second gate electrode traversing over the first fin and the second fin, respectively. In addition, the semiconductor device includes a gate dielectric layer between the first fin and the first gate electrode and between the second fin and the second gate electrode. Further, the semiconductor device includes a dummy gate electrode over the substrate, and the dummy gate electrode is between the first gate electrode and the second gate electrode. An upper portion of the dummy gate electrode is wider than a lower portion of the dummy gate electrode.

In accordance with some embodiments, a semiconductor device is provided. The semiconductor device includes a substrate. The semiconductor device also includes a first fin and a second fin over the substrate. The semiconductor device further includes a first gate electrode and a second gate electrode traversing over the first fin and the second fin, respectively. In addition, the semiconductor device includes a gate dielectric layer between the first fin and the first gate electrode and between the second fin and the second gate electrode. Further, the semiconductor device includes a dummy gate electrode over the substrate, and the dummy gate is between the first fin and the second fin. A recess is at a lower portion of the dummy gate electrode.

In accordance with some embodiments, a method for forming a semiconductor device is provided. The method includes forming a first fin and a second fin over a substrate and depositing a gate dielectric layer and a gate electrode layer over the first fin, the second fin, and the substrate. The method also includes performing an etching process to partially remove the gate electrode layer such that a first gate electrode and a second gate electrode are formed to respectively traverse over the first fin and the second fin. A dummy gate electrode is also formed over the substrate and between the first fin and the second fin, and a bottom portion of the dummy gate electrode is recessed.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for forming a semiconductor device, the method comprising:
    forming a first fin and a second fin;
    forming an isolation region between the first fin and the second fin;
    forming a gate dielectric layer over the first fin, the second fin, and the isolation region;
    forming a gate electrode layer over the gate dielectric layer;
    performing a first etching process, wherein the first etching process partially removes an upper portion of the gate electrode layer to form an upper portion of a first gate electrode over the first fin, an upper portion of a second gate electrode over the second fin, and an upper portion of a dummy gate electrode over the isolation region, wherein the first etching process is stopped when the gate dielectric layer over the first fin and over the second fin is exposed while the gate dielectric layer over the isolation region is covered by the gate electrode layer; and
    performing a second etching process different from the first etching process after the first etching process is stopped, wherein the second etching process partially removes a lower portion of the gate electrode layer to form the first gate electrode, the second gate electrode, and the dummy gate electrode, wherein the second etching process is stopped after the gate dielectric layer over the isolation region is removed, wherein after the second etching process, the upper portion of the dummy gate electrode has a first width, a lower portion of the dummy gate electrode has a second width different from the first width.

2. The method of claim 1, wherein the lower portion of the dummy gate electrode tapers off as the lower portion of the dummy gate electrode extends toward the isolation region.

3. The method of claim 1, wherein the upper portion of the first gate electrode has a third width, and a lower portion of the first gate electrode has a fourth width different from the third width.

4. The method of claim 3, wherein the first width is larger than the second width, and the third width is smaller than the fourth width.

5. The method of claim 1, wherein the first etching process and the second etching process are performed using different etchants.

6. The method of claim 5, wherein the second etching process is performed using a mixture of a first etchant and a second etchant.

7. The method of claim 6, wherein the method further comprises changing a ratio between the first etchant and the second etchant to modify a lateral etching rate of the second etching process.

8. The method of claim 6, wherein the first etching process is performed using $Cl_2$, $SF_6$, $N_2$, $CF_4$, $CHF_3$, $CH_2F_2$, $N_2H_2$, $O_2$, He, or combinations thereof.

9. The method of claim 8, wherein the first etchant of the second etching process comprises $Cl_2$, and the second etchant of the second etching process comprises $CHF_3$, or $CH_2F_2$.

10. The method of claim 5, wherein the first etching process and the second etching process are performed in a same process chamber.

11. The method of claim 10, further comprising after the first etching process and before the second etching process, removing unused portions of an ethant used for the first etching process from the process chamber.

12. A method for forming a semiconductor device, the method comprising:
- forming a first fin and a second fin over a substrate, the first fin extending parallel to the second fin;
- forming an isolation region over the substrate between the first fin and the second fin, wherein the first fin and the second fin protrude above the isolation region;
- depositing a gate electrode layer over the first fin, the second fin, and the isolation region; and
- etching the gate electrode layer to form a first gate electrode over the first fin, a second gate electrode over the second fin, and a dummy gate electrode over the isolation region between the first fin and the second fin, wherein a lower portion of the dummy gate electrode is narrower than an upper portion of the dummy gate electrode, wherein a lower portion of the first gate electrode is wider than an upper portion of the first gate electrode.

13. The method of claim 12, wherein a sidewall of the lower portion of the first gate electrode forms a first angle with an upper surface of the substrate, and a sidewall of the lower portion of the dummy gate electrode forms a second angle with the upper surface of the substrate, the first angle being different from the second angle.

14. The method of claim 13, wherein the first angle is an obtuse angle, and the second angle is an acute angle.

15. The method of claim 12, wherein etching the gate electrode layer comprises:
- performing a first etching process to remove an upper portion of the gate electrode layer; and
- after stopping the first etching process, performing a second etching process to remove a lower portion of the gate electrode layer, wherein the first etching process uses an etchant different from an etchant of the second etching process.

16. The method of claim 15, further comprising forming a gate dielectric layer over the first fin, the second fin, and the isolation region before depositing the gate electrode layer.

17. The method of claim 16, wherein the first etching process is stopped when the gate dielectric layer over the first fin and the second fin is exposed while the gate dielectric layer over the isolation region is covered by the gate electrode layer.

18. A method for forming a semiconductor device, the method comprising:
- forming a first fin over a substrate;
- forming a gate electrode layer over the first fin and the substrate;
- performing a first etching process to remove an upper portion of the gate electrode layer disposed over an upper surface of the first fin, the first etching process forming an upper portion of a first gate electrode over the first fin and forming an upper portion of a dummy gate electrode adjacent to the first fin; and
- performing a second etching process different from the first etching process to remove a lower portion of the gate electrode layer, the second etching process forming a lower portion of the first gate electrode and a lower portion of the dummy gate electrode, wherein after the second etching process, the first gate electrode and the dummy gate electrode extend parallel to each other, wherein a sidewall of the lower portion of the first gate electrode forms a first angle with a lower surface of the first gate electrode facing the substrate, and a sidewall of the lower portion of the dummy gate electrode forms a second angle with a lower surface of the dummy gate electrode facing the substrate, the first angle being different from the second angle.

19. The method of claim 18, wherein a first width of the lower portion of the dummy gate electrode is smaller than a second width of the upper portion of the dummy gate electrode, and wherein a third width of the lower portion of the first gate electrode is larger than a fourth width of the upper portion of the first gate electrode.

20. The method of claim 18, further comprising forming a gate dielectric layer over the first fin before forming the gate electrode layer, wherein the first etching process is stopped when the gate dielectric layer over the first fin is exposed.

* * * * *